United States Patent [19]
King et al.

[11] Patent Number: 4,715,115
[45] Date of Patent: Dec. 29, 1987

[54] PACKAGE FOR WAFER-SCALE SEMICONDUCTOR DEVICES

[75] Inventors: Michael O. King, Fremont; Marvin S. Keshner, Mtn. View, both of Calif.

[73] Assignee: Hewlett-Packard Company, Palo Alto, Calif.

[21] Appl. No.: 847,410

[22] Filed: Apr. 3, 1986

[51] Int. Cl.[4] .................. H01L 23/12; H01L 23/14
[52] U.S. Cl. .................................. 29/841; 29/569.1; 357/66; 361/387
[58] Field of Search .................. 29/589, 840, 841; 357/66, 81, 82; 361/387

[56] References Cited
FOREIGN PATENT DOCUMENTS
0020783  2/1977  Japan ..................................... 357/66

OTHER PUBLICATIONS

Van Vestrout, "Floating Backbond Mounting", IBM Technical Discl. Bulletin, vol. 16, No. 3, p. 766, 8/1973.
"Wafer Scale Integration: An Appraisal", by Ron Iscoff, West Coast Editor, *Semiconductor International;* Sep. 1984, pp. 62-65.
"Wafer Scale Integration: The Limits of VLSI?", by Douglas L. Peltzer, Trilogy Systems Corp., *VLSI Design,* Sep. 1983, pp. 43-47.

Primary Examiner—Howard N. Goldberg
Assistant Examiner—Taylor J. Ross
Attorney, Agent, or Firm—Saundra S. Hand

[57] ABSTRACT

The invention is a method of packaging whole or large silicon wafers that provides support for the wafer, eliminates thermally or package-induced wafer strain, and allows selection of a mounting substrate material that provides optimal heat conduction.

6 Claims, 2 Drawing Figures

PACKAGE FOR WAFER-SCALE SEMICONDUCTOR DEVICES

BACKGROUND OF THE INVENTION

Device packaging has been a major obstacle to the successful implementation of wafer-scale integration (WSI). WSI implies that a large integrated circuit is created which covers the entire substrate of a silicon wafer, possibly as large as six inches in diameter. Instead of dicing the wafer into smaller chips for individual packaging, the wafer-scale circuit remains whole, intensifying the normal packaging problems of integrated circuits.

Integrated circuits, in general, are very susceptible to damage caused by excessive strain in the silicon wafer. Such strain can damage the fine line circuitry, alter the electrical properties of the various materials present, or even fracture the wafer itself. The wafers are generally rigidly attached to a support structure in some means to protect the wafer from externally applied loads, such as shock loading, bending, etc. However, this protective structure itself may produce forces on the wafer which can cause damage to the wafer. Excessive strain can be the result of differential thermal expansion of the wafer and its support structure, and the mechanism for attaching the wafer to the support structure may also stress the wafer due to high clamping forces, tensile, compressive, or bending loads, etc., that it applies to the wafer.

Previous embodiments of the WSI packaging are shown in FIG. 1. The wafer 1 is rigidly attached to the substrate 2 by a system of clamps 3 and/or adhesive bond 4. In either case, the substrate 2 material must be carefully chosen to closely match the coefficient of thermal expansion of the wafer 1, in order to minimize the strain on the wafer 1 that would be caused by differential expansion of the two materials. Some materials that have been used are molybdenum and various ceramics. These materials are expensive and difficult to manufacture, and are not necessarily the best thermal conductors available.

SUMMARY OF THE INVENTION

The invention is a method of packaging whole or large silicon wafers that provides support for the wafer, eliminates thermally or package-induced wafer strain, and allows selection of a mounting substrate material that provides optimal heat conduction. The methods of removing heat from the outside of the package are well known and are not included in this invention.

The present invention is described in FIG. 2. The wafer 5 is placed on substrate 6, which is made to be very flat, but wafer 5 is not rigidly attached to substrate 6. A thin layer of a viscous or semi-viscous thermally conductive fluid 7 resides between the wafer 5 and the supporting substrate 6. The fluid 7 provides the thermal conduction path between the wafer 5 and its supporting substrate 6 (and thence to the outside environment) necessary to remove the heat produced by the circuit on the wafer 5. The wafer 5 is held in the Z direction to the support substrate 6 by the surface tension of the fluid 7, but is free to expand, contract, or move relative to the supporting substrate 6 in the X-Y plane without inducing strain in the wafer 5. Wafer 5 position is maintained loosely by the flex circuits 8 which also effect the electrical interconnections to the wafer. The flex circuits 8 are mounted to the water 5 and to the suport substrate 6 in such a way to allow some motion of the wafer 5, yet constrain that motion to a prescribed safe zone. Since the flex-circuits 8 are very flexible, they do not put compressive, tensile, or bending loads of appreciable magnitude on the wafer 5. A small elastic force may be applied in the Z direction by some elastic material 9 to maintain contact between the wafer 5 and its support substrate 6 in the event of large shock loads. This elastic material 9 is chosen so that it does not rigidly constrain the motion or position of the wafer 5 in the X-Y plane. Since the mounting substrate 6 is very planar, and since the elastic material 9 does not constrain the wafer's 5 position in the X-Y directions, very little strain is experienced by the wafer due to the force applied by material 9. A cover 10 is provided to maintain the environment surrounding the wafer 5, and to provide protection to the wafer 5.

DETAILED DESCRIPTION OF THE INVENTION

Figure 1:
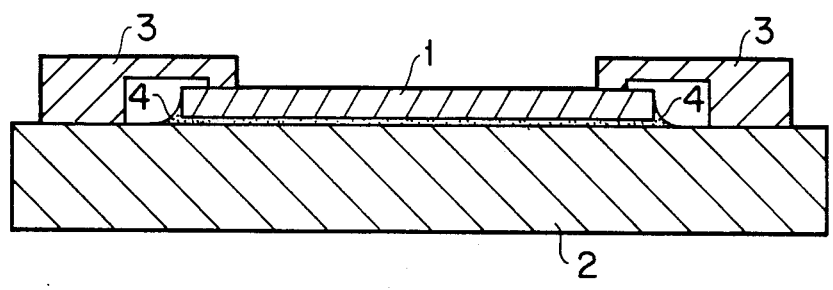
FIG. 1 shows the prior art method of packaging whole or large wafer-scale circuits.
Figure 2:
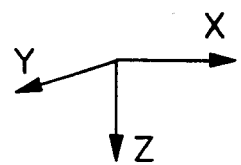
FIG. 2 shows the preferred embodiment of the present invention.
Figure 2:
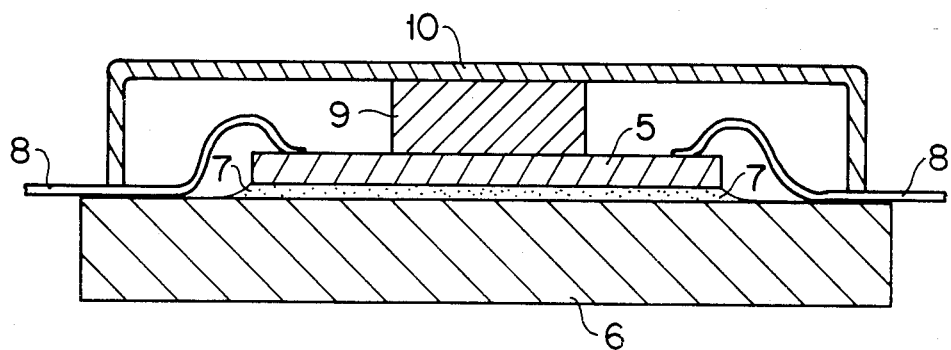

The description of the preferred embodiment of the invention refers to FIG. 2. The surface of the supporting substrate 6 is made very flat by surface grinding, lapping, double disc grinding, etc. These methods of producing the flat substrate of substrate 6 are preferred to turning operations. Turning operations produce a surface which is conical in shape due to misalignment of the axis of the part rotation and the tool's path. Such a conical shape causes strain of the wafer 5 if loads are applied in the Z direction, either by the elastic material 9, by gravity, shock, or by some other loading. The preferred methods listed above do not have this tendency, and are well-developed and inexpensive. The support substrate 6 material is any suitable material, and selection can be made on the basis of cost, thermal conductivity, or any other relevant parameter; material choice is not limited to materials that have coefficients of thermal expansion near that of the wafer 5. A likely candidate for the material of substrate 6 is aluminum.

The flex circuits 8 are metal conductors placed on a thin, flexible substrate, such as polyimide, and effect all electrical connections to the wafer 5. The flex circuits 8 are arranged around the wafer 5 in such a way so as to constrain the position of the wafer 5 within a safe zone, yet they do not apply appreciable force on the wafer in any direction, thus not inducing any strain on the wafer 5. The wafer 5 is free to expand or contract relative to the support substrate 6 without inducing strain in the wafer 5.

The elastic material 9, which could be rubber or low density foam, is rigidly attached to the cover 10, but is only attached to the wafer 5 by friction. There is no relative motion between the elastic material 9 and the wafer 5 at the interface of these two materials; the motion of wafer 5, which in all cases is very small, is translated to strain in the elastic material 9.

A cover 10, which can be made of any convenient material, is placed over the wafer 5 and is rigidly attached to the support substrate 6. The cover 10 protects the wafer 5, and anchors the elastic material 9.

We claim:

1. An apparatus for packaging a wafer comprising:

a substrate for supporting the wafer;
a viscous or semi-viscous fluid means for providing surface tension between the wafer and the substrate to restrict the wafer's motion in a direction perpendicular to the plane of the substrate;
a means mounted to the wafer for loosely clamping the wafer to the substrate for restricting the wafer's motion in a direction parallel to the plane of the substrate;
a cover attached to the substrate for shielding the wafer; and
an elastic means for restricting the wafer's motion in a direction perpendicular to the plane of the substrate wherein the elastic means is located between the wafer and the cover.

2. An apparatus as in claim 1 wherein the means mounted to the wafer makes electrical connections with the wafer.

3. An apparatus as in claim 1 wherein the means mounted to the wafer is is a clamp attached to the substrate.

4. An apparatus as in claim 1 wherein the fluid means conducts heat from the wafer to the substrate.

5. An apparatus as in claim 1 wherein the elastic means applies a force to the wafer.

6. An apparatus as in claim 1 wherein the elastic means is a low density foam.

* * * * *

UNITED STATES PATENT AND TRADEMARK OFFICE
CERTIFICATE OF CORRECTION

PATENT NO. : 4,715,115

DATED : December 29, 1987

INVENTOR(S) : Michael O. King and Marvin S. Keshner

It is certified that error appears in the above-identified patent and that said Letters Patent is hereby corrected as shown below:

Column 1, line 67, "water" should read -- wafer --;

Column 3, line 7, "clamping the wafer to the substrate for" should be deleted;

Column 4, line 7, "is is a clamp" should be deleted.

Signed and Sealed this

Sixteenth Day of August, 1988

Attest:

DONALD J. QUIGG

Attesting Officer

Commissioner of Patents and Trademarks